(12) United States Patent
Merckel et al.

(10) Patent No.: US 6,784,518 B1
(45) Date of Patent: Aug. 31, 2004

(54) INTEGRATED CIRCUIT DEVICE COMPRISING AN INDUCTOR WITH HIGH QUALITY COEFFICIENT

(75) Inventors: Gérard Merckel, Montbonnot (FR); Michel Pons, Meylan (FR); Patrice Senn, Grenoble (FR); Jean Michel Fournier, Meylan (FR)

(73) Assignee: France Télécom, Paris (FR)

( * ) Notice: Subject to any disclaimer, the term of this patent is extended or adjusted under 35 U.S.C. 154(b) by 0 days.

(21) Appl. No.: 09/553,916

(22) Filed: Apr. 20, 2000

(30) Foreign Application Priority Data

Apr. 20, 1999 (FR) .............................................. 99 04986

(51) Int. Cl.$^7$ .............................................. H01L 29/00
(52) U.S. Cl. ...................................... 257/531; 438/329
(58) Field of Search .......................... 257/9, 281, 347, 257/368, 379, 401, 531, 539, 546, 584, 635, 777; 438/314, 329, 335

(56) References Cited

U.S. PATENT DOCUMENTS

| | | | | |
|---|---|---|---|---|
| 3,792,319 A | * | 2/1974 | Tsang ....................... 317/235 R |
| 4,323,986 A | * | 4/1982 | Malaviva ..................... 365/174 |
| 5,021,758 A | | 6/1991 | Lane |
| 5,378,939 A | * | 1/1995 | Marsland et al. ........... 307/352 |
| 5,521,783 A | * | 5/1996 | Wolfe et al. ................. 361/56 |
| 5,705,963 A | * | 1/1998 | Ikeda et al. ................. 333/184 |
| 5,764,106 A | * | 6/1998 | Deen et al. .................. 330/279 |
| 5,793,096 A | | 8/1998 | Yu et al. |
| 5,831,331 A | | 11/1998 | Lee |
| 5,834,826 A | * | 11/1998 | Menegoli ..................... 257/546 |
| 5,858,850 A | * | 1/1999 | Gomi .......................... 438/314 |
| 5,929,510 A | * | 7/1999 | Geller et al. ................. 257/635 |
| 5,965,930 A | * | 10/1999 | Sakamoto et al. .......... 257/584 |
| 5,973,368 A | * | 10/1999 | Pearce et al. ................ 257/368 |
| 6,057,555 A | * | 5/2000 | Reedy et al. ................... 257/9 |
| 6,114,768 A | * | 9/2000 | Gaul et al. ................... 257/777 |
| 6,121,659 A | * | 9/2000 | Christensen et al. ........ 257/347 |
| 6,134,424 A | * | 10/2000 | Nishihori et al. ........... 455/127 |
| 6,404,575 B1 | * | 6/2002 | Yen .............................. 360/46 |

FOREIGN PATENT DOCUMENTS

| | | |
|---|---|---|
| EP | 484 558 | 5/1992 |
| EP | 780 853 | 6/1997 |

* cited by examiner

*Primary Examiner*—David Nelms
*Assistant Examiner*—David Vu
(74) *Attorney, Agent, or Firm*—Meyertons, Hood, Kivlin, Kowert & Goetzel, P.C.; Eric B. Meyertons

(57) ABSTRACT

The integrated circuit comprises an inductor made at a metallization level of the circuit and a buried layer situated in the substrate of the integrated circuit under the said inductor, and connection means linking the inductor to the buried layer. The connection means are configured in such a way as to ensure the same potential in terms of dynamic response between the inductor and the buried layer. This equipotential is ensured by a transistor in a follower type arrangement made in the substrate and connected in parallel with the stray capacitances under the inductor.

9 Claims, 5 Drawing Sheets

INTEGRATED CIRCUIT DEVICE COMPRISING AN INDUCTOR WITH HIGH QUALITY COEFFICIENT

The present invention relates to an integrated circuit device comprising an inductor with high quality coefficient. The quality coefficient or quality factor of an inductor, generally dubbed Q, is defined as the ratio between the imaginary part and the real part of the impedance of the inductor. This coefficient can be measured with the aid of a network analyser.

The regular reduction in the dimensions of the active devices such as a transistor in integrated circuits, in particular on silicon, is necessary to allow an increase in the density of integration and leads to an improvement in their frequency performance. Nowadays, radio frequency functions such as a low noise amplifier (LNA), a mixer, a power amplifier or else a voltage controlled oscillator (VCO) can be integrated for frequencies above 2 GHz.

A silicon-based integrated circuit comprises a substrate of intrinsic silicon (pure silicon) into which have been introduced impurities such as atoms from group III of the Periodic Table (boron B, gallium Ga, etc.), and P doped silicon is then obtained.

A layer of insulating material, $SiO_2$ for example, is interposed between the substrate and the inductor. The inductor is made in the form of a spiral situated at the last level of metal which is generally aluminium.

As may be seen in FIG. 1 which is a sectional view of the inductor, this inductor is made in the form of turns Sp deposited above an insulating layer of silicon oxide $SiO_2$ which is itself deposited on a substrate of silicon Si. To take account of the stray effects, a stray coupling is manifested by capacitances Cp representing the capacitance of the insulating layer between the inductor and the substrate and leakage resistances Rp modelling the leakages of energy in the substrate. FIG. 2 illustrates an electrical modelling of the inductor and of its stray components, in which the inductor is modelled by a pure self-inductance L and a series resistance Rs, and the stray capacitances Cp are linked to the leakage resistances Rp.

Thus, if one studies the changes in the quality coefficient Q as a function of frequency f, one observes different behaviour depending on the frequency domain. Curve 2 of FIG. 3 represents these changes in the quality coefficient Q for a real inductance. At low frequency the quality factor Q increases with frequency as in the case of an ideal inductance ($Q=L2\pi f/Rs$) represented by curve 1 in FIG. 3, when it reaches a maximum Qmax for a resonant frequency $F_0$. At high frequency Q then decreases, departing from curve 1 representing an ideal inductance and in doing so increasing the stray capacitances Cp1 and Cp2. This phenomenon manifests the fact that at high frequency these capacitances Cp1 and Cp2 constitute low impedances and that the dissipation of energy in the leakage resistances Rp1 and Rp2 becomes large. The stray elements, namely Cp1, Cp2, Rp1 and Rp2, therefore limit the maximum value Qmax of the quality coefficient and the resonant frequency $F_0$. Beyond $F_0$, the inductor no longer behaves as a true inductor. It is difficult to make an integrated inductor having a high quality coefficient Q since the stray elements are inherent in its construction. The series resistance Rs also contributes to the limiting of the quality coefficient Q. The assembly consisting of the series resistance and stray elements means that, in FIG. 3, curve 2 of the real inductance departs from curve 1 of the ideal inductance having a quality coefficient which increases with frequency both at low frequencies and at high frequencies.

The use of inductances with high quality coefficients is necessary in numerous situations so as to allow the integration of radio-frequency functions (a few GHz) with good characteristics. This is the case more particularly for circuits carrying out the following functions: VCO (voltage controlled oscillator), PA (power amplifier), filters, LNA (low noise amplifier).

In the case of VCOs the reduction in the phase noise is largely dependent on the quality coefficient Q of the LC circuit (made up of inductances and capacitances) of the oscillator. The circuits of the PA type, the gain and the efficiency are greatly improved if the passive elements, such as the inductor, exhibit minimal losses. Furthermore, the integration of passive filters is made easier by inductors of high quality coefficient.

Systems are known which make it possible to increase the quality coefficient at higher and higher frequencies by acting on various parameters:
- increasing the thickness of the metal layer;
- choosing a less resistive metal, for example employing copper instead of aluminium;
- moving the metal layer further from the substrate;
- locally modifying the resistivity of the substrate by using a patterned substrate.

These modifications relate to the technology of integrated circuits.

In the prior art, a system is known for improving the quality coefficient by eliminating the series resistance Rs. To do this, a new active circuit is introduced which produces a negative resistance in series with the self-inductance L and the series resistance Rs. However, the proper operation of this device requires rigorous knowledge of the values of the components, especially an absolute value of the negative resistance not exceeding the value of the series resistance Rs on risk of engendering an oscillation phenomenon. The stray elements limiting the value of the quality coefficient Q and the resonant frequency $F_0$ cannot be sufficiently eliminated using this system.

An embodiment aims to afford a solution to this problem by reducing the influence of the stray capacitances and of the leakage resistances in relation to the inductance.

An embodiment is to improve the quality coefficient Q.

An embodiment is an integrated circuit comprising an inductor made at a metallization level of the circuit and a buried layer situated in the substrate of the integrated circuit under the said inductor.

In an embodiment, the integrated circuit includes a connector linking the inductor to the buried layer and configured in such a way as to ensure the same potential in terms of dynamic response between the inductor and the buried layer. The signal at the output of the inductor is reproduced identically, same phase and same amplitude, at the level of the buried layer. The terminals of the stray capacitances, more particularly of the stray capacitance Cp2, are thus at the same potential in terms of dynamic response, thus making it possible to render the capacitance Cp2 invisible by the circuit. The injurious effects of this capacitance therefore no longer effect the inductor. It is thus possible to increase the frequency of operation of the integrated inductor.

Preferably, the connector includes a transistor in a follower type arrangement made in the substrate. Advantageously, this transistor in a follower type arrangement is a bipolar transistor biased in emitter follower mode. The "follower" characteristic makes it possible to "copy" the signal present on a terminal of the inductor at the level of the buried layer. Furthermore, the leakage resistances Rp are thus now supplied by a current coming from the transistor rather than via the inductor. To avoid extra integration cost and energy consumption due to the active component, namely the transistor, one advantageously uses a transistor which is already implanted in the integrated circuit such as a transistor used as a buffer in a low noise amplifier (LNA) circuit for example.

According to a variant of the invention, the transistor in a follower type arrangement can be a MOS transistor (Metal Oxide Semiconductor) as shown in FIG. 9. This MOS transistor may or may not be associated with a bipolar transistor in a follower type arrangement.

In an embodiment, the connector includes, between the transistor and the buried layer, a resistance of sufficiently low value as to ensure substantially the same potential between the inductor and the buried layer. This low-value resistance makes it possible to avoid any oscillation problems which may come about when the series resistance Rs is very low on the order of 1.5 Ohms or less than this value. The low-value resistance which is added has a value of the order of 5 Ohms. This value is low relative to the value of the leakage resistances Rp which is several hundred Ohms such as 250 Ohms for example. This difference in magnitude guarantees that the transistor is always regarded as a voltage generator imposing a potential on the buried layer substantially identical to the potential of the inductor owing to the fact that a resistance of low value with respect to the load resistance, namely the leakage resistances, is placed between the buried layer and the emitter of the transistor. Thus, this added resistance avoids any oscillations and by reason of its low value keeps the inductor and the buried layer equipotential.

According to an embodiment, the integrated circuit operating at a given working frequency, the transition frequency of the transistor is much greater than the working frequency. Thus, the characteristics of the transistor are not degraded, in particular its transconductance gain, for a given working frequency.

Moreover, the buried layer is preferably a layer of patterned type. It may also be non-patterned or else made of a metal material. In all cases, this structure minimizes the coupling of the inductor with the substrate.

In an embodiment, the transistor is biased in such a way that the current passing through it is capable of charging stray capacitances appearing between the buried layer and the substrate of the integrated circuit. The transistor bias current is thus fixed in such a way as to obtain a compromise between optimal frequency behaviour of the transistor and reason consumption.

One embodiment is directed to a process for improving the quality coefficient of an inductor in an integrated circuit. Generally the said inductor is linked to a buried layer in the substrate of the integrated circuit in such a way as to render the inductor and the buried layer equipotential in terms of dynamic response.

A transistor can be connected in a follower type arrangement between the inductor and the buried layer so as to maintain the same potential between the inductor and the buried layer.

The transistor and the buried layer can be linked with the aid of a resistance.

Advantageously, the transistor is biased in such a way that the current passing through it is capable of charging stray capacitances appearing between the buried layer and the substrate of the integrated circuit.

Described hereinbelow, by way of wholly non-limiting example and with reference to the appended drawings, is a device according to the invention.

Figure 2:
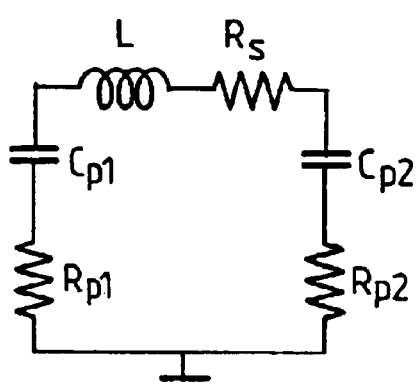
FIG. 2 depicts an electrical diagram of an inductor.
Figure 1:
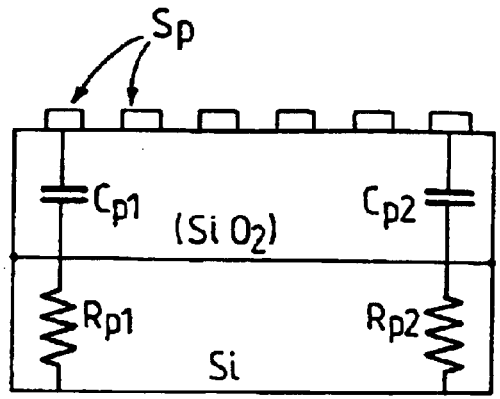
FIG. 1 depicts a sectional view of an inductor.
Figure 3:
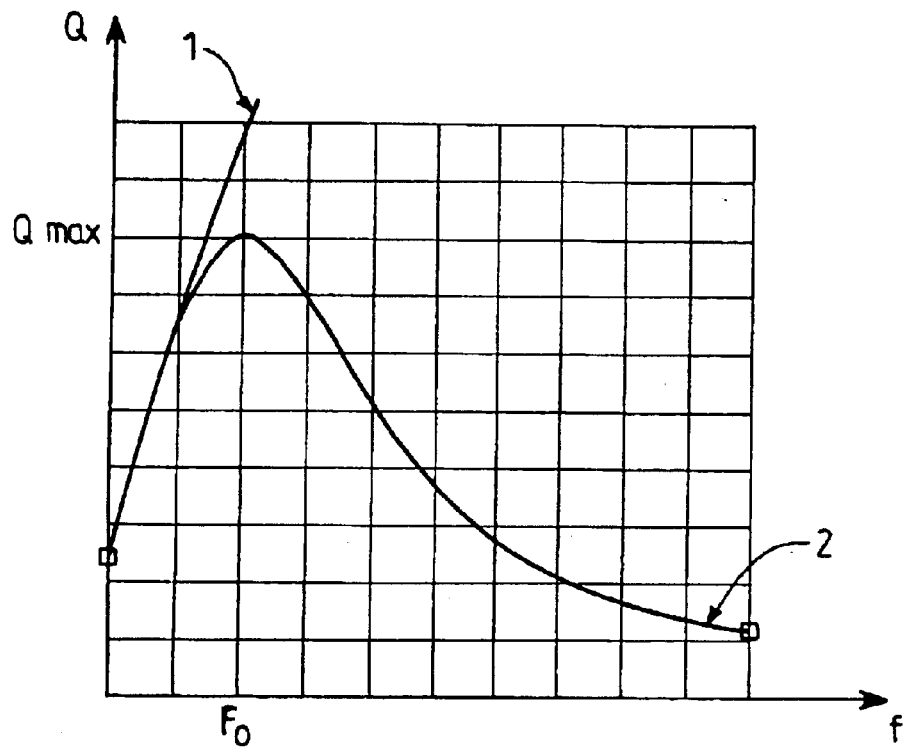
FIG. 3 depicts changes in quality factor as a function of frequency.
Figure 4:
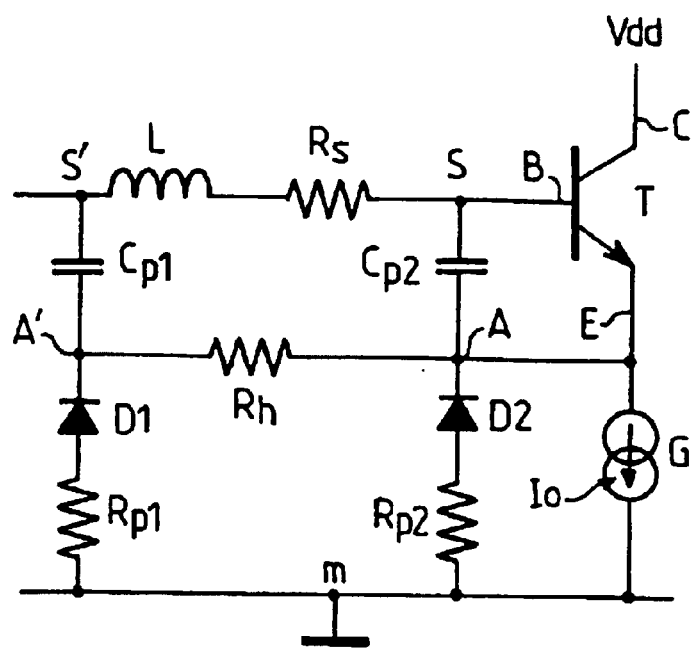
FIG. 4 is an electrical diagram of the inductor and of the follower transistor.

FIG. 4 illustrates a model of the inductor of the same type as that of FIG. 3 with the pure self-inductance L of 5 nH connected in series with the series resistance Rs at 16Ω, the two ends of this assembly are a point S' on the self-inductance L-side and a point S on the series resistance Rs side. The two stray capacitances Cp1 and Cp2 of 0.13 pF are respectively connected by one end to the points S' and S. A resistance Rh is placed between the two free ends of the capacitances Cp1 and Cp2, that is to say the points A' and A. The resistance Rh of around 50Ω represents the buried layer. Between the point A' and a point m representing earth there is a diode D1 whose cathode is on the point A' side and the leakage resistance Rp1 of 410Ω. Between the point A and the point m there is a diode D2 whose cathode is on the point A side and the leakage resistance Rp2 of 250Ω. The diodes D1 and D2 being permanently reverse-biased, they can be regarded as two capacitances Cd1 and Cd2. The point S represents the output of the inductor, the series resistance Rs modelling the resistance of the inductor.

A bipolar transistor T of npn type is connected in such a way that its base is linked to the point S and its emitter is linked to the point A in parallel with the capacitance Cp2. The transistor T is biased in emitter follower mode with the aid of a bias current $I_0$ and of a bias circuit which is not represented. The bias current $I_0$ is produced by a current generator G connected between the emitter of the transistor situated at the point A and the point m. The AC base-emitter voltage of the transistor T is kept zero in terms of dynamic response over a wide frequency range, thus making it possible to cancel out the effect of the coupling due to Cp2 with the substrate. The influence of Cp1 is also attenuated but with lesser effectiveness.

At radio frequency, with the aid of this transistor in a follower type arrangement, the terminals of the capacitance Cp2 are substantially at the same potential and this capacitance is therefore no longer seen by the circuit. The energy dissipated by the leakage resistances Rp1 and Rp2 is now provided by the transistor T rather than by the inductor. A fraction of the emitter current is in effect injected into the resistances Rp1 and Rp2 via the diode capacitances Cd1 and Cd2. Thus the inductance is no longer damped by the resistances Rp1 and Rp2 with respect to the case without a transistor of follower type in which the resistances Rp1 and Rp2 were supplied directly through the inductor across the stray capacitances Cp1 and Cp2.

The inductance sees a high impedance on the base of the transistor, this being equivalent to greatly reducing the capacitances Cp1 and Cp2.

The quality factor Q and the frequency $F_0$ for which the overvoltage is a maximum, i.e. Q equal to Qmax, is thus increased.

This apparent reduction in Cp1 and Cp2 also makes it possible to increase the area of the inductor with a consequent reduction in Rs and consequently in this case also an improvement in the quality factor.

The capacitances Cd1 and Cd2, which are of the order of a few picofarads, must be able to be charged by the transistor T. The transistor T therefore possesses a high transconductance so as to be able to provide a sufficiently high current.

An inductor in an embodiment possesses a quality coefficient which varies according to an ideal quality coefficient (see FIG. 3) as long as the working frequency remains within a range for which the transistor operates correctly, that is to say a frequency for which the current-gain of the transistor is much greater than one, for example greater than ten. This transition frequency of the transistor must therefore be sufficiently high so as not to limit the quality coefficient. Moreover, the current-gain of the follower transistor must be much greater than one in order for the follower transistor to operate under good conditions.

Figure 5:
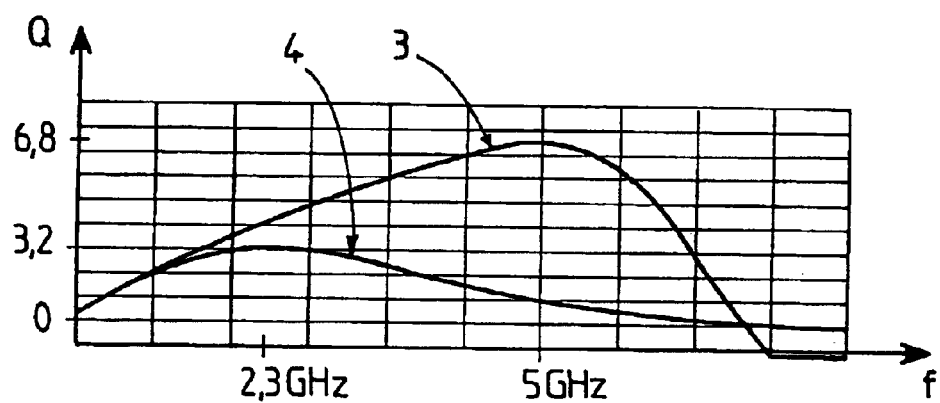
FIG. 5 illustrates the changes in the quality coefficient as a function of transition frequency: curve 3 according to an embodiment and curve 4 according to the prior art.

In FIG. 5 may be seen two curves of the quality coefficient Q as a function of working frequency (frequency of operation of the circuit). Curve 3 relates to an integrated inductor. Curve 4 relates to an integrated inductor according to the prior art, that is to say without a transistor in a follower type arrangement. The parameter Q in curve 3 increases with frequency at low frequencies up to a maximum value of 6.8 for a frequency of 5 GHz, then decreases with frequency at high frequencies under the effect of the limiting of the transition frequency of the transistor in a follower type arrangement. Whereas in the case of an inductor with no follower transistor, curve 4 of the quality coefficient increases with frequency at low frequencies up to a maximum value of 3.2 for a frequency of 2.3 GHz, values much lower than those of curve 3, then decreases with frequency at high frequencies under the effect of the stray elements such as the capacitances Cp1, Cp2 and the resistances Rp1, Rp2. The cause of the bending of the curve is not the same for curves 3 and 4. The presence of the transistor in a follower type arrangement therefore clearly has the effect of increasing the quality coefficient Q as well as the frequency for which this coefficient is a maximum. Here, an increase by a factor of greater than 2 is observed.

Figure 6:
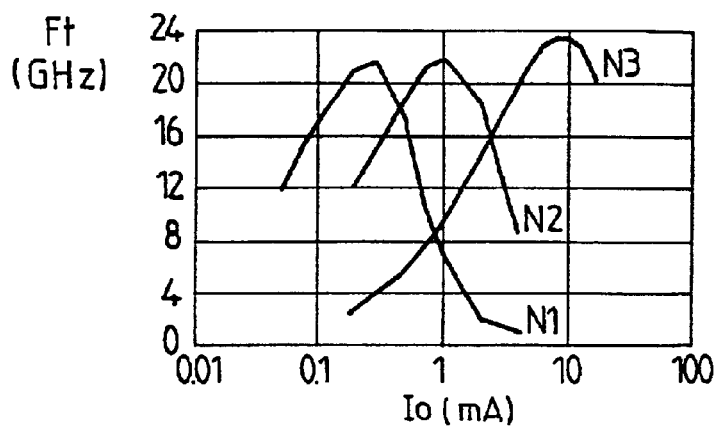
FIG. 6 illustrates the changes in the transition frequency as a function of the collector bias current for three types of transistors.

FIG. 6 shows the changes in the transition frequency Ft as a function of the bias current $I_0$ for three types of transistors with different emitter areas and a supply voltage of 1.5 volts. Curve N1 corresponds to a transistor $T_{N1}$ with emitter area equal to $S_{N1}$. Curve N2 corresponds to a transistor $T_{N2}$ of emitter area equal to $S_{N2}$. Curve N3 corresponds to a transistor $T_{N3}$ of emitter area equal to $S_{N3}$. These areas are such that $S_{N1}<S_{N2}<S_{N3}$. The transistors $T_{N1}$ and $T_{N2}$ are optimized in respect of their transition frequency by a bias current of less than a milliampere on account of their area being less than that of the transistor $T_{N3}$ which is optimized therefor for a current $I_0$ of 8 mA. These transistors have a maximum transition frequency of between 20 GHz and 24 GHz. The transistor $T_{N2}$ gives the best result in so far as it makes it possible to obtain the smallest voltage across the terminals of the stray capacitance Cp2 (0.8 times that obtained with the transistor $T_{N2}$) and the highest quality factor (6.8 instead of 4.4 obtained with $T_{N2}$). It possesses the following characteristics: (BiCMOS5 library: N4E1) emitter area A=0.35*4.55 $\mu m^2$; I=1 mA; Ft=22 GHz.

Figure 7:
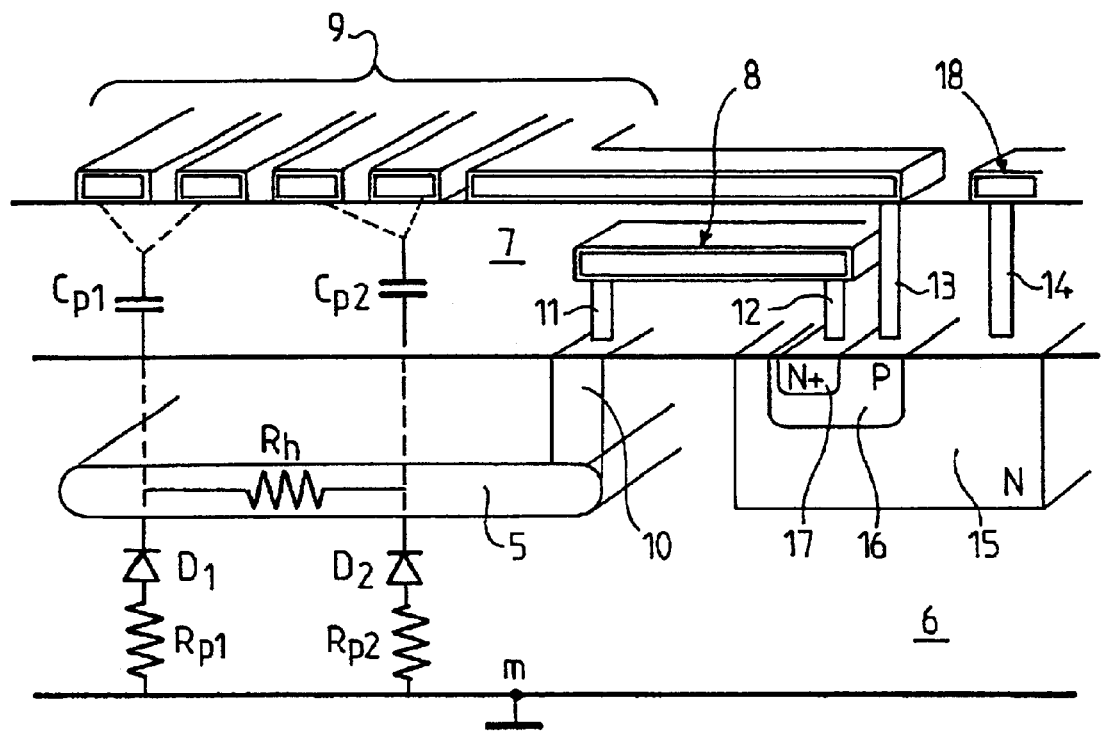
FIG. 7 is a simplified sectional view of the inductor and of the follower transistor with simplified modelling of the inductor.

The electrical diagram of FIG. 4 is illustrated in engineering form in FIG. 7. FIG. 7 shows a substrate 6 on which is deposited an insulating $SiO_2$ layer 7. A point m represents the lower surface of the substrate 6. This substrate 6 is composed of P doped silicon and inside comprises an N+ doped buried layer 5 characterized by a resistance Rh. The junction between the buried layer 5 and the substrate 6 is modelled by the diode D1, connected by its cathode to one end of the resistance Rh, the said diode D1 being in series with the resistance Rp1 linked on the other side to the point m. This junction between the buried layer 5 and the substrate 6 is also modelled by the diode D2, connected by its cathode to the other end of the resistance Rh, the said diode D2 being in series with the resistance Rp2 linked on the other side to the point m. A portion 10 of N+ doped silicon situated within the substrate is connected to the buried layer 5 and to the insulating layer 7.

Within the substrate, alongside the buried layer, is implanted a bipolar transistor T in a conventional manner. To do this, a portion 15 of N doped silicon is firstly created in the substrate 6 with an area of the portion 15 in contact with the insulating layer 7. An aluminium contact 14 situated in the insulating layer 7 is connected to this portion 15. A portion 16 of P doped silicon is then created in the portion 15 with an area of the portion 16 in contact with the insulating layer 7. An aluminium contact 13 situated in the insulating layer 7 is connected to this portion 16. Then a portion 17 of N+ doped silicon is created in the portion 16 with an area of the portion 17 in contact with the insulating layer 7. An aluminium contact 12 situated in the insulating layer 7 is connected to this portion 17. The transistor T is formed by 15, 16 and 17. Hereinafter, the emitter will designate the contact 12, the base will designate the contact 13 and the collector will designate the contact 14. The emitter 12 is linked to one end of a metal portion 8 situated in the insulating layer 7. A metal contact 11 links the metal portion 8 and the portion 10 of N+ doped silicon. The buried layer 5 and the emitter 12 are therefore linked by the elements 10, 11 and 8.

The insulating layer 7 extends above the buried layer 5 and the transistor T. The collector 14 is connected to a metal layer 18, via which the transistor is supplied with voltage, above the insulating layer 7.

A metal spiral 9 is deposited above and in contact with the insulating layer 7. This metal layer 9 extends above the buried layer 5 and a part of the transistor T, in particular the portions 16 and 17. The metal layer 9 forms the inductor and it is linked to the base 13 of the transistor T. The insulating layer 7 is modelled by two stray capacitances Cp1 and Cp2 linked on one side to the inductor 9 and on the other side each to one end of the resistance Rh.

The buried layer S is weakly resistive (Rh) so as to exhibit an equipotential surface. This buried layer 5 is implanted "meshed" or "patterned". The buried layer need not be "meshed" or "patterned" but could be continuous and/or made of a metal material. In all cases it is made in such a way as to minimize the coupling with the substrate and consequently the electromagnetic losses.

Moreover, in different varieties of circuits for radio-frequency applications, a N+ buried layer is already provided and the type of follower transistor is already implanted and used as a buffer. In this case it is sufficient to make the emitter connection with the N+ buried layer, this mainly requiring modification of the mask serving in the production of the metal level 8 referenced in FIG. 7.

Figure 8:
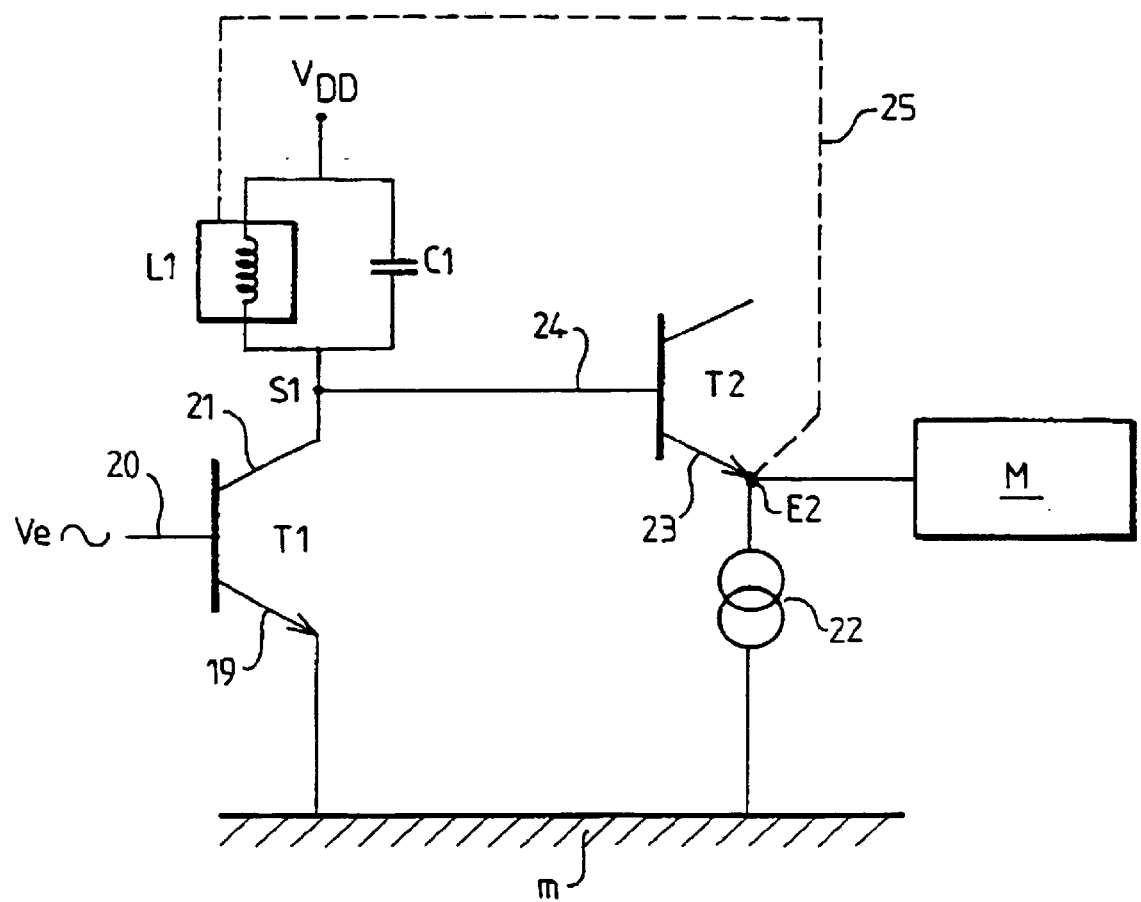
FIG. 8 is a simplified electrical diagram of an amplifier connected to a mixer.
Figure 9:
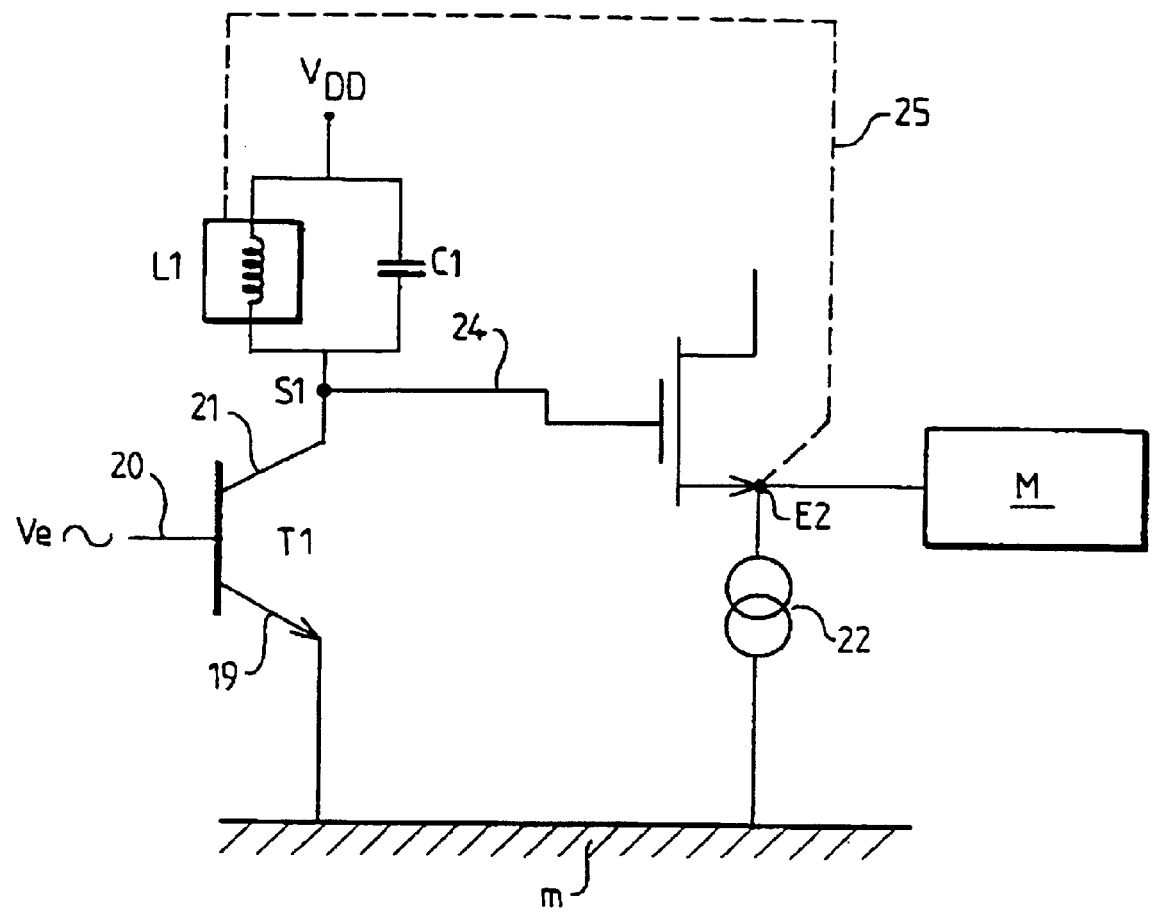
FIG. 9 depicts an embodiment of an electrical diagram of Metal Oxide Semiconductor transistor.

Such a circuit is for example an LNA amplifier (low noise amplifier) such as represented in FIG. 8. This amplifier consists of a transistor T1 for which the emitter 19 is earthed and the base 20 accepts an input signal Ve. The collector 21 of this transistor T1 is connected to one end S1 of a tank circuit composed of an integrated inductor L1 in parallel with an integrated capacitance C1 (non-stray). The other end of the tank circuit is linked to a supply voltage Vdd. An output signal VS1 is measured at the point S1. This circuit makes it possible to have a very high amplification factor (VS1/Ve) around a given resonant frequency F1 dependent on the quality coefficient of the inductor L1. To operate at higher frequencies than F1, the quality coefficient according to the invention can be improved by acting on the inductor L1.

However, this kind of circuit is generally followed by another circuit such as a mixer circuit M. This mixer requires for its operation that it be preceded by a circuit of low output impedance. For this purpose, interposed between the amplifier LNA (consisting of T1, L1 and C1) and the mixer M is a bipolar transistor T2 biased in follower emitter mode with the aid of a current generator 22 connected to the emitter 23 of the transistor T2. The base 24 of the transistor T2 is linked to the output of the LNA amplifier at the point S1. The mixer M is connected to the transistor T2 via the emitter 23. Thus, the signal VS1 is reproduced at E2 since T2 is a follower transistor, and the mixer sees a low impedance at its input, this being the output impedance of the bipolar transistor T2.

Then, to increase the quality coefficient, and hence to increase the frequency of operation of the LNA amplifier, one uses the transistor T2 which is in a follower type arrangement. A connection 25 is made between the emitter 23 and a buried layer (not represented) under the integrated inductor L1. The improvement in the quality coefficient costs nothing other than the production of the connection 25.

The introduction of a transistor in a follower type arrangement into the electrical circuit of an integrated inductor and the connecting of the emitter of this active element to a buried layer situated in the substrate under the inductor so as to place this layer and this inductor at the same potential in terms of dynamic response make it possible to minimize the influence of the stray elements, while thereby improving the quality factor. It is thus possible to increase the thickness of the metal layer constituting the integrated inductor in such a way as to reduce the series resistances and thereby to further improve the quality coefficient. Furthermore, the additional energy consumption due to this active element (the transistor) is advantageously controlled.

What is claimed is:

1. Integrated circuit, comprising an inductor made at a metallization level of the circuit, a buried layer situated in a substrate of the integrated circuit under the inductor, and a connector linking the inductor to the buried layer, wherein the connector comprises a transistor biased in an emitter follower mode made in the substrate so as to ensure the same potential in terms of dynamic response between the inductor and the buried layer.

2. Integrated circuit according to claim 1, wherein the transistor in a follower type arrangement is a bipolar transistor biased in emitter follower mode.

3. Integrated circuit according to claim 2, further comprising a current generator connected to the emitter of the bipolar transistor biased in emitter follower mode.

4. Integrated circuit according to claim 1, wherein the transistor in a follower type arrangement is a MOS transistor (Metal Oxide Semiconductor).

5. Integrated circuit according to claim 1, wherein the connector further comprises, between the transistor and the buried layer, a resistor having a resistance such that the transistor imposes a potential on the buried layer that is substantially identical to the potential imposed in the inductor.

6. Integrated circuit according to claim 1, wherein the integrated circuit is able to operate at a working frequency, and wherein a transition frequency of the transistor is much greater than the working frequency.

7. Integrated circuit according to claim 1, wherein the transistor is biased such that a current passing through the transistor charges stray capacitances appearing between the buried layer and the substrate of the integrated circuit.

8. An integrated circuit, comprising:
   a substrate;
   a buried layer formed in the substrate; and
   an inductor formed above the buried layer, wherein the inductor is linked to the buried layer by a connector, wherein the connector comprises a transistor implanted in the substrate, and wherein the transistor is connected in an emitter follower mode between the inductor and the buried layer.

9. Integrated circuit according to claim 8, wherein the transistor is biased such that a current passing through the transistor charges stray capacitances appearing between the buried layer and the substrate of the integrated circuit.

* * * * *